(12) United States Patent
Kambayashi et al.

(10) Patent No.: US 8,999,788 B2
(45) Date of Patent: Apr. 7, 2015

(54) MANUFACTURING METHOD OF GAN-BASED SEMICONDUCTOR DEVICE AND SEMICONDUCTOR DEVICE

(71) Applicants: Tohoku University, Sendai-shi, Miyagi (JP); Furukawa Electric Co., Ltd., Chiyoda-ku, Tokyo (JP)

(72) Inventors: Hiroshi Kambayashi, Yokohama (JP); Akinobu Teramoto, Sendai (JP); Tadahiro Ohmi, Sendai (JP)

(73) Assignees: Tohoku University, Miyagi (JP); Furukawa Electric Co., Ltd., Tokyo (JP)

(*) Notice: Subject to any disclaimer, the term of this patent is extended or adjusted under 35 U.S.C. 154(b) by 0 days.

(21) Appl. No.: 13/950,079

(22) Filed: Jul. 24, 2013

(65) Prior Publication Data

US 2013/0307063 A1    Nov. 21, 2013

Related U.S. Application Data

(63) Continuation of application No. PCT/JP2012/000404, filed on Jan. 23, 2012.

(30) Foreign Application Priority Data

Jan. 25, 2011   (JP) .................... 2011-013425

(51) Int. Cl.
| | | |
|---|---|---|
| H01L 21/336 | (2006.01) | |
| H01L 21/306 | (2006.01) | |
| H01L 29/66 | (2006.01) | |
| H01L 29/778 | (2006.01) | |
| H01L 21/02 | (2006.01) | |
| H01L 29/78 | (2006.01) | |
| H01L 29/20 | (2006.01) | |
| H01L 29/423 | (2006.01) | |
| H01L 29/51 | (2006.01) | |

(52) U.S. Cl.
CPC .... *H01L 21/30604* (2013.01); *H01L 29/66462* (2013.01); *H01L 29/66522* (2013.01); *H01L 29/7783* (2013.01); *H01L 21/02521* (2013.01); *H01L 29/7827* (2013.01); *H01L 21/02057* (2013.01); *H01L 21/30621* (2013.01); *H01L 21/0254* (2013.01); *H01L 21/02664* (2013.01); *H01L 29/2003* (2013.01); *H01L 21/0237* (2013.01); *H01L 21/02458* (2013.01); *H01L 21/02507* (2013.01); *H01L 29/4236* (2013.01); *H01L 29/51* (2013.01)

(58) Field of Classification Search
CPC .................... H01L 29/66462; H01L 21/76877
USPC .......... 257/194, 201, 330, E29.246, E21.403; 438/44, 270, 167, 172
See application file for complete search history.

(56) References Cited

FOREIGN PATENT DOCUMENTS

| JP | 08-023152 | * | 1/1996 |
| JP | 2010-170974 | * | 8/2010 |
| JP | 2010-272728 | * | 12/2010 |

OTHER PUBLICATIONS

Written Opinion for corresponding international application No. PCT/JP2012/000404 (7 pages).

*Primary Examiner* — Shahed Ahmed
(74) *Attorney, Agent, or Firm* — Lowe Hauptman & Ham, LLP

(57) ABSTRACT

Provided is a method of manufacturing a gallium-nitride-based semiconductor device, comprising forming a first semiconductor layer of a gallium-nitride-based semiconductor; and forming a recessed portion by dry etching a portion of the first semiconductor layer via a microwave plasma process using a bromine-based gas.

11 Claims, 22 Drawing Sheets

MANUFACTURING METHOD OF GAN-BASED SEMICONDUCTOR DEVICE AND SEMICONDUCTOR DEVICE

The contents of the following patent applications are incorporated herein by reference:
No. 2011-013425 filed in Japan on Jan. 25, 2011, and
No. PCT/JP2012/000404 filed on Jan. 23, 2012.

BACKGROUND

1. Technical Field

The present invention relates to manufacturing method for a gallium nitride (GaN)-based semiconductor device and a semiconductor device.

2. Related Art

Dry-etching of a GaN-based semiconductor can employ ICP-RIE (inductively coupled plasma reactive-ion etching) using a chlorine-based gas, as shown in Non-Patent Document 1, for example.

Non-Patent Document 1: Technical Report of the IEICE, 2009, ED. 2009-43

However, the electron temperature is high in inductively coupled plasma. With ICP-RIE, high-energy ions collide with the semiconductor, thereby causing the etching surface to be uneven and damaging the semiconductor, which results in a decrease in the electrical characteristics of the semiconductor device. Furthermore, when etching a GaN-based semiconductor, if a chlorine-based gas such as chlorine ($Cl_2$) or boron trichloride ($BCl_3$) is used as the etching gas, chlorides and the like are formed in the surface, and therefore chlorine remains in the etched surface. This residual chlorine acts as an impurity, and therefore the resulting GaN-based semiconductor device has impaired carrier flow, which causes a reduction in the electrical characteristics.

Therefore, it is an object of an aspect of the innovations herein to provide a manufacturing method for a GaN-based semiconductor device and a semiconductor device, which is capable of overcoming the above drawbacks accompanying the related art. The above and other objects can be achieved by combinations described in the claims.

SUMMARY

According to a first aspect of the present invention, provided is a semiconductor device manufacturing method comprising forming a first sacrificial layer that contacts the first semiconductor layer and has a higher solid solubility for impurities included in the first semiconductor layer than the first semiconductor layer; annealing the first sacrificial layer and the first semiconductor layer; removing the first sacrificial layer through a wet process; after removing the first sacrificial layer, performing at least one of forming an insulating layer that covers at least a portion of the first semiconductor layer and etching a portion of the first semiconductor layer; and forming an electrode layer electrically connected to the first semiconductor layer.

According to a second aspect of the present invention, provided is a GaN-based semiconductor device comprising a first semiconductor layer; a recessed portion formed by removing a portion of the first semiconductor layer; and a second semiconductor layer that is formed of a GaN-based semiconductor under the first semiconductor layer. In the recessed portion, the amount of halogen in the recessed surface of the second semiconductor layer is no greater than 3 atom %.

According to a third aspect of the present invention, provided is a GaN-based semiconductor device manufacturing method, comprising forming a first semiconductor layer of a GaN-based semiconductor; and forming a recessed portion by etching a portion of the first semiconductor layer through a microwave plasma process, using a bromine-based gas.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
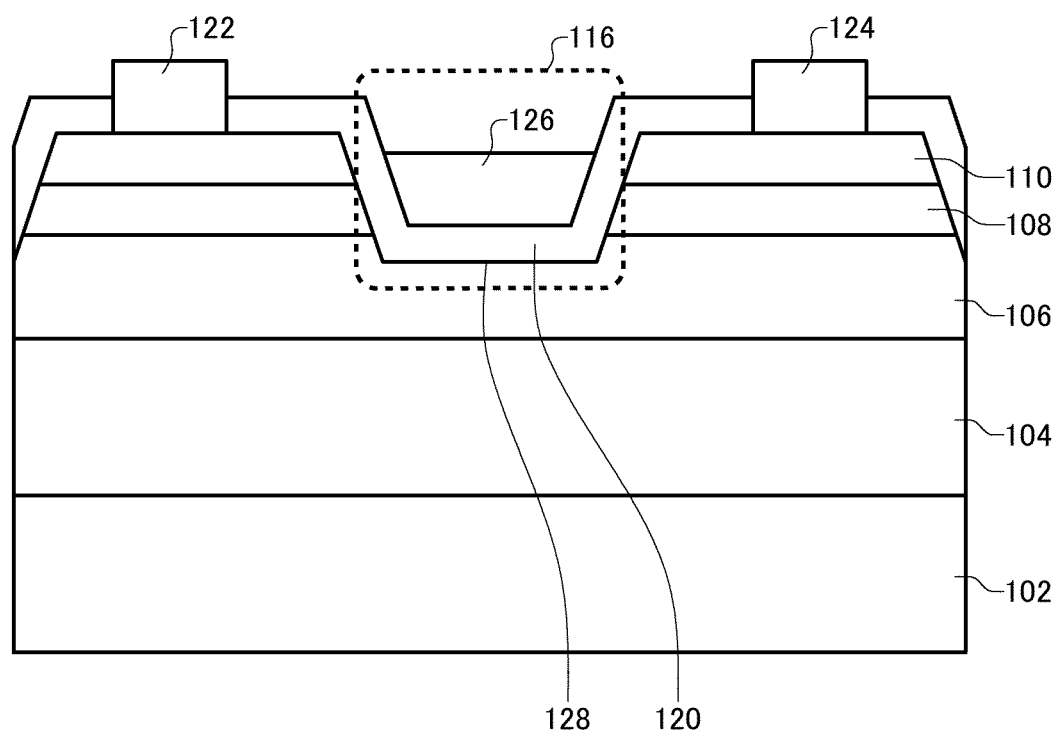
FIG. 1 is a schematic cross-sectional view of the semiconductor device of the present invention.

FIG. 1 is a schematic cross-sectional view of a semiconductor device 100 manufactured according to the manufacturing methods of a first or second embodiment of the present invention. The semiconductor device 100 may be a GaN-based MOS field effect transistor, for example. The semiconductor device 100 includes a substrate 102, a buffer layer 104, a channel layer 106, a drift layer 108, an electron supply layer 110, a gate insulating film 120, a source electrode 122, a drain electrode 124, and a gate electrode 126.

The substrate 102 may be a silicon substrate, with the (111) surface as the primary surface. As another example, the substrate 102 may be a sapphire substrate with the (0001) c-surface as the primary surface. Furthermore, the substrate 102 may be a SiC substrate or a GaN substrate. The buffer layer 104 is formed on the substrate 102. The buffer layer 104 is a semiconductor layer formed by stacking eight layers each of a semiconductor layer formed of GaN and a semiconductor layer formed of AlN, in an alternating manner. The semiconductor layer of GaN has a thickness of 200 nm, for example. The semiconductor layer of AlN has a thickness of 20 nm, for example. The channel layer 106 is formed on the buffer layer 104. The channel layer 106 is a semiconductor layer formed of p-type GaN with a thickness of 500 nm, and is doped with approximately $1 \times 10^{17}$ cm$^{-3}$ of Mg, for example. The dopant in the channel layer 106 may instead be Zn or Be.

The drift layer 108 is formed on the channel layer 106. The drift layer 108 is a semiconductor layer (u-GaN layer) formed of undoped GaN with a thickness of 20 nm, for example. A semiconductor layer of GaN in which the p-type impurity concentration is less than that of the channel layer 106 may be used as the drift layer 108. The electron supply layer 110 is formed on the drift layer 108. The electron supply layer 110 is a semiconductor layer of $Al_YGa_{1-Y}N$ (Y=0.25) with a thickness of 20 nm, for example. The Al composition ratio in the electron supply layer 110 may be set in a range of 0<Y<1. The $Al_YGa_{1-Y}N$ may have a larger bandgap than the GaN. Due to the bandgap difference and Piezo effect, two-dimensional electron gas is formed near the interface between the drift layer 108 and the electron supply layer 110.

A recessed portion 116 is formed in a portion of a region between the source electrode 122 and the drain electrode 124. In this recessed portion 116, portions of the electron supply layer 110 and the drift layer 108 are removed. Furthermore, a recessed surface 128 is formed below the electron supply layer 110 and the drift layer 108, by removing a portion of the surface of the channel layer 106.

The surface of the gate insulating film 120 contacts the recessed surface 128 of the channel layer 106, the side surfaces of the drift layer 108, and the side surface of the electron supply layer 110, thereby covering these surfaces. The gate insulating film 120 is a $SiO_2$ film with a thickness of 60 nm, for example. However, in the region where the source electrode 122 and the drain electrode 124 are formed, the gate insulating film 120 is removed.

The source electrode 122 and the drain electrode 124 are formed on portions of the electron supply layer 110. The source electrode 122 and the drain electrode 124 are each a composite layer obtained by forming an Al layer with a thickness of 300 nm on a Ti layer with a thickness of 25 nm, for example. The source electrode 122 and the drain electrode 124 may be formed over the entirety of the electron supply layer 110. The source electrode 122 and the drain electrode 124 may be other metal materials with large work functions, and may be composite layers of Ti/AlSi/Mo, for example.

The gate electrode 126 is formed on the gate insulating film 120, in the recessed portion 116. The gate electrode 126 is a composite layer obtained by forming an Al layer with a thickness of 300 nm on a Ti layer with a thickness of 25 nm, for example. The gate electrode 126 may instead be a composite layer of Ti/Au, for example.

The electron supply layer 110 and the drift layer 108 are removed at the edges of the semiconductor device 100, in order to be isolated from other adjacent elements. Furthermore, some or all of the channel layer 106 and the buffer layer 104 may be removed at the edges of the semiconductor device 100, in order to increase the isolation from other adjacent elements.

Figure 2A:
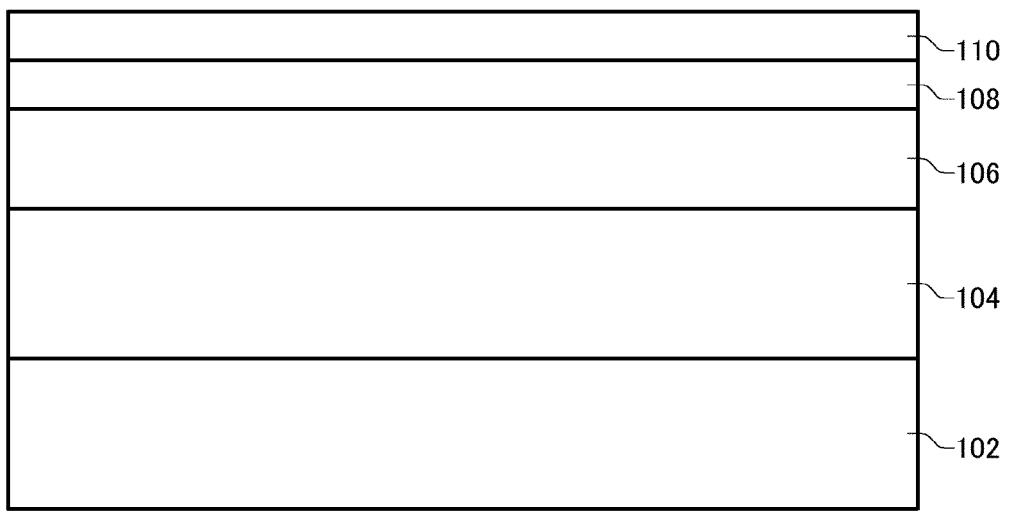
FIG. 2A shows a method for manufacturing the semiconductor device of the first embodiment shown in FIG. 1, according to the first embodiment of the present invention.
Figure 2B:
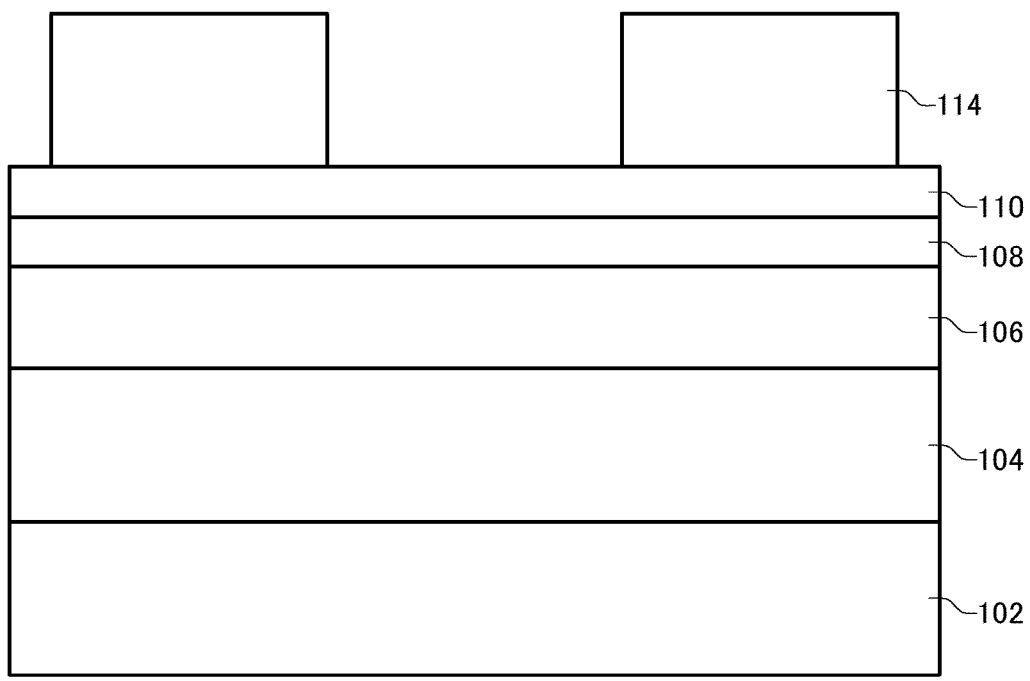
FIG. 2B shows a method for manufacturing the semiconductor device of the first embodiment shown in FIG. 1, according to the first embodiment of the present invention.
Figure 2C:
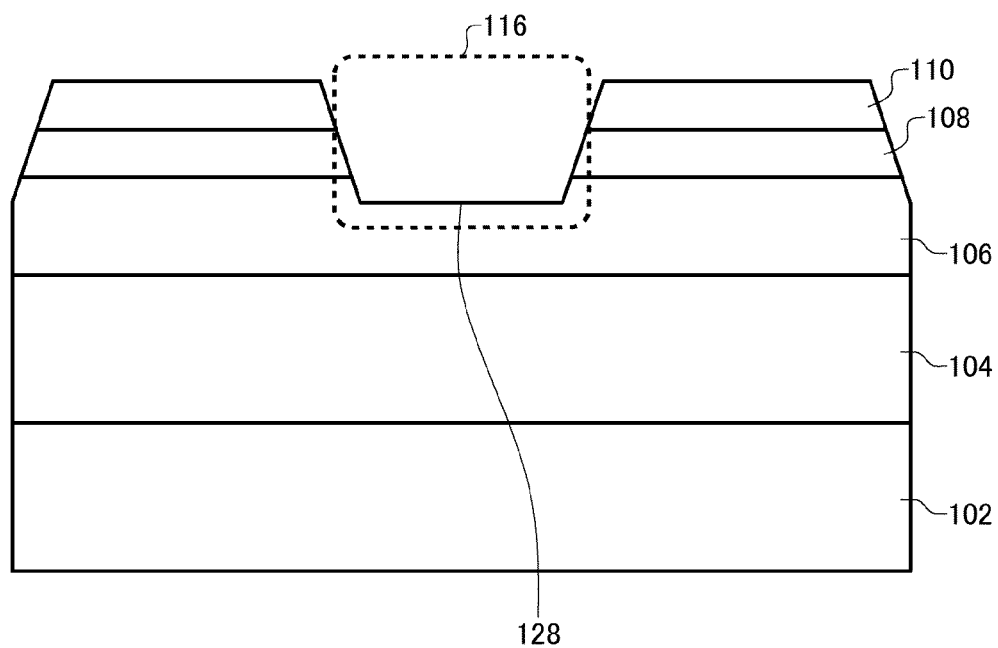
FIG. 2C shows a method for manufacturing the semiconductor device of the first embodiment shown in FIG. 1, according to the first embodiment of the present invention.

FIGS. 2A to 2C show a method for manufacturing the semiconductor device 100 shown in FIG. 1, according to the first embodiment of the present invention. In FIGS. 2A to 2C, components that have the same reference numerals as components in FIG. 1 may have the same function and configurations as these components as described in relation to FIG. 1. FIG. 2A shows a state in which the buffer layer 104, the channel layer 106, the drift layer 108, and the electron supply layer 110 have been formed on the substrate 102.

The buffer layer 104, which is formed by layering a plurality of GaN layers and AlN layers, and the channel layer 106 formed of p-type GaN, may be epitaxially grown on the substrate 102 through MOCVD, using trimethylgallium (TMGa), trimethylaluminum (TMAl), and ammonia ($NH_3$). Bis(cyclopentadienyl)magnesium ($Cp_2Mg$) may be used, with the Mg of the channel layer 106 as the doping source.

The drift layer 108 formed of u-GaN may be epitaxially grown on the channel layer 106 through MOCVD, using TMGa and $NH_3$. The electron supply layer of $Al_YGa_{1-Y}N$ is epitaxially grown on the drift layer 108 through MOCVD, using TMGa, TMAl, and $NH_3$. The growth temperature of the buffer layer 104, the channel layer 106, the drift layer 108, and the electron supply layer 110 may be set to 1050° C., and hydrogen gas may be used as the carrier gas.

FIG. 2B shows a state in which the mask layer 114 has been formed on the electron supply layer 110 shown in FIG. 2A. The mask layer 114 is formed of amorphous silicon, for example. An amorphous silicon (a-Si) layer with a thickness of 500 nm is formed on the electron supply layer 110 using plasma chemical vapor deposition (PCVD). Then, the mask layer 114 is realized by patterning the formed a-Si layer through photolithography and dry etching using $CF_4$ gas.

FIG. 2C shows a state in which the recessed portion 116 has been formed. After the mask layer 114 shown in FIG. 2B is formed, the recessed portion 116 is formed through dry etching with a microwave plasma process, using a bromine-based gas. The microwave plasma process is a process of etching a target with an etching gas that has been turned into plasma by microwaves. The recessed surface 128 may be formed by dry etching the portions of the electron supply layer 110 and the drift layer 108 that are not covered by the mask layer 114 to remove these portions in the depth direction, thereby partially exposing the channel layer 106 that is formed below the drift layer 108. Furthermore, a portion of the surface of the channel layer 106 may undergo dry etching to form the recessed surface 128 of the channel layer 106.

The mask layer 114 also undergoes the dry etching at the same time, and therefore the mask layer 114 is preferably thick enough to prevent all of the mask layer 114 from being etched away during the etching of the electron supply layer 110 and the drift layer 108. The bromine-based etching gas is hydrogen bromide (HBr), for example. Instead, the bromine-based etching gas may be bromine ($Br_2$), boron tribromide ($BBr_3$), or a mixture of these.

After this, the remaining mask layer 114 is removed, and the gate insulating film 120, the source electrode 122, the drain electrode 124, and the gate electrode 126 are formed, thereby completing the semiconductor device 100. The gate insulating film 120 of $SiO_2$ may be formed using PCVD, with $SiH_4$ and $N_2O$ as the raw material gas. Portions of the gate insulating film 120 may be removed by fluoric acid to expose the electron supply layer 110. The source electrode 122 and the drain electrode 124 may be formed on the exposed portions of the electron supply layer 110 using a lift-off technique. The gate electrode 126 may be formed on the gate insulating film 120 of the recessed portion 116, using a lift-off technique.

Figure 3:
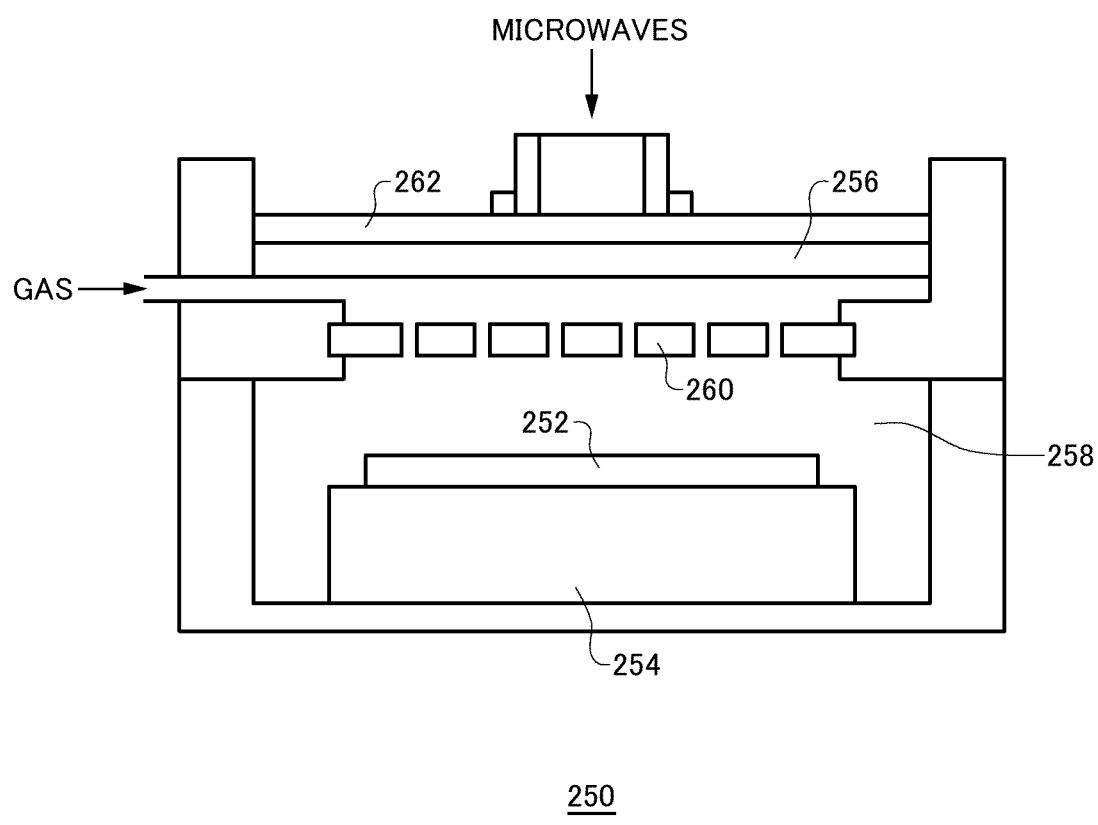
FIG. 3 is a cross-sectional view of the microwave plasma apparatus.

FIG. 3 is a schematic cross-sectional view of a microwave plasma apparatus 250 that performs the dry etching through the microwave plasma process. The microwave plasma apparatus 250 includes a stage 254, an antenna 262 that supplies microwaves, a dielectric 256 that introduces the microwaves, a showerhead 260 that introduces the etching gas between the dielectric and the processed substrate, and a processing chamber 258 that performs a process using plasma. The processed substrate 252 is arranged on the stage 254.

The bromine-based gas introduced from the showerhead 260 is changed to plasma by the microwaves introduced from the dielectric 256, to perform dry etching on the semiconductor layer formed on the processed substrate 252. The antenna 262 is a flat surface antenna that has a plurality of slot-shaped holes, for example. The antenna 262 may be an RLSA (Radial-Line Slot-Array) antenna.

Microwaves with a frequency of 915 MHz, for example, are used in the microwave plasma process. As another example, microwaves with a frequency between 900 MHz and 2.5 GHz can be used. For example, microwaves with a frequency of 1.98 GHz or 2.45 GHz can be used.

Figure 4:
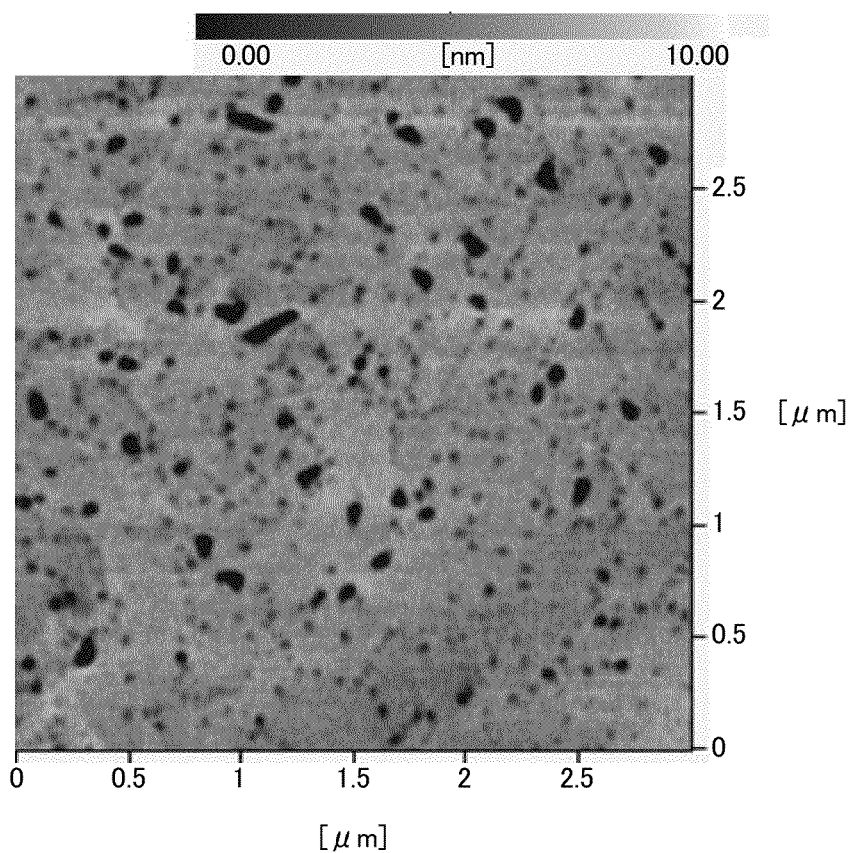
FIG. 4 is an AFM image of the semiconductor device manufactured according to the manufacturing method of the first embodiment.

FIG. 4 is an AFM image of the recessed surface 128 of the channel layer 106 formed using the process shown in FIG. 2C. The microwave plasma process has excellent uniformity, and therefore the following characteristics are achieved: the arithmetic mean roughness value Ra of the recessed surface 128 of the channel layer 106 is no greater than 1 nm, the difference (P–V) between the maximum peak height and the maximum valley depth of the cross-sectional curve of the recessed surface 128 is no greater than 15 nm, and the root mean square roughness RMS of the recessed surface 128 is no greater than 1.4 nm. In the semiconductor device manufactured using the manufacturing method of the first embodiment, the arithmetic mean roughness value Ra of the recessed surface 128 was 0.6773 nm, the difference (P–V) between the maximum peak height and the maximum valley depth of the cross-sectional curve was 11.61 nm, and the root mean square roughness RMS was 1.235 nm.

Figure 5:
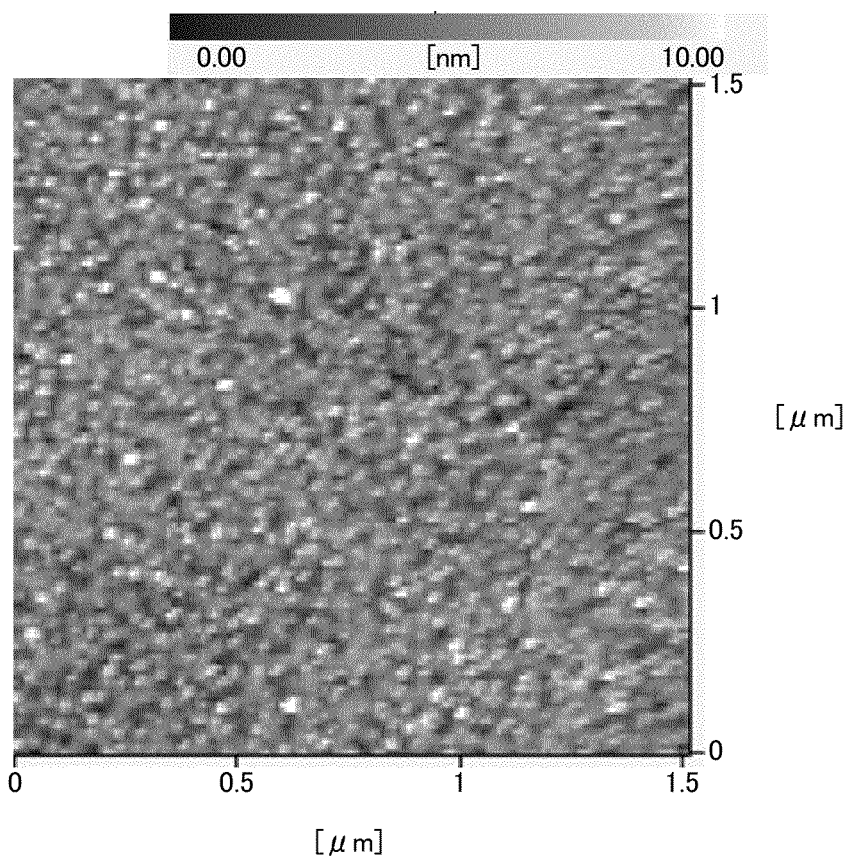
FIG. 5 is an AFM image of the semiconductor device of a comparative example.

FIG. 5 shows a comparative example, which is an AFM image of a recessed surface 128 in the state shown in FIG. 2C when the partial etching of the electron supply layer 110 and the drift layer 108 and the partial etching of the surface of the channel layer 106 were performed with ICP-RIE. In this case, the arithmetic mean roughness value Ra of the recessed surface 128 was 1.1112 nm, the difference (P–V) between the maximum peak height and the maximum valley depth of the cross-sectional curve was 16.27 nm, and the root mean square roughness RMS was 1.436 nm. In inductively coupled plasma, the electron temperature is high and the ion types with high energy collide with the recessed surface 128, and therefore the resulting etched surface has a large amount of roughness.

Table 1 shows results obtained by analyzing the elemental composition of the recessed surface 128 shown in FIG. 4, using X-ray photoelectron spectroscopy (XPS). As a comparison example, surface compositions of the recessed surface 128 are shown that were obtained in the state shown in FIG. 2C when the partial etching of the electron supply layer 110 and the drift layer 108 and the partial etching of the surface of the channel layer 106 were performed using the microwave plasma process with chlorine gas ($Cl_2$). In Table 1, elements for which 0.0 atom % is recorded are less than the minimum detection limit in an XPS analysis.

TABLE 1

| | ETCHING GAS | ELEMENT COMPOSITION (atom %) | | | | |
|---|---|---|---|---|---|---|
| | | Ga | N | Br | Cl | TOTAL |
| SEMICONDUCTOR DEVICE MANUFACTURED ACCORDING TO THE MANUFACTURING METHOD OF THE FIRST EMBODIMENT | HBr | 59.8 | 40.0 | 0.2 | 0.0 | 100.0 |
| COMPARATIVE EXAMPLE | $Cl_2$ | 57.5 | 37.9 | 0.0 | 4.6 | 100.0 |

When bromine-based gas is used as the etching gas, the amount of halogen in the recessed surface 128 of the channel layer is no greater than 3 atom %. With the manufacturing method according to the first embodiment, when using HBr as the etching gas, the amount of halogen in the recessed surface 128 was 0.2 atom %. In contrast, when a chlorine-based gas was used as the etching gas, a large amount of halogen remained in the surface of the GaN-based semiconductor after the etching. In the comparative example in Table 1, the amount of chlorine remaining in the recessed surface 128 was 4.6 atom %. This is because chlorine is prone to remaining in the semiconductor surface. When halogen particles remain in the surface of the channel layer 106, the electron field-effect mobility of the carrier is decreased. Accordingly, the amount of halogen remaining in the surface of the channel layer 106 is preferably low.

Figure 6A:
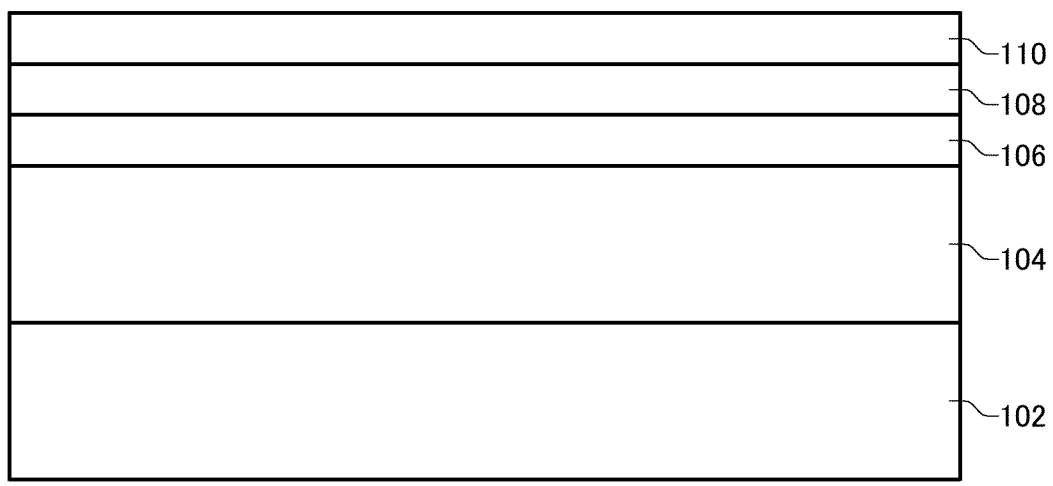
FIG. 6A shows a method for manufacturing the semiconductor device of the first embodiment shown in FIG. 1, according to the second embodiment of the present invention.

FIGS. 6A to 6E show the method of manufacturing the semiconductor device 100 of FIG. 1, according to the manufacturing method of the second embodiment of the present invention. In FIGS. 6A to 6E, components that have the same reference numerals as components in FIGS. 2A to 2C may have the same function and configurations as these components as described in relation to FIGS. 2A to 2C. FIG. 6A shows a state in which the buffer layer 104, the channel layer 106, the drift layer 108, and the electron supply layer 110 have been formed on the substrate 102.

Figure 6B:
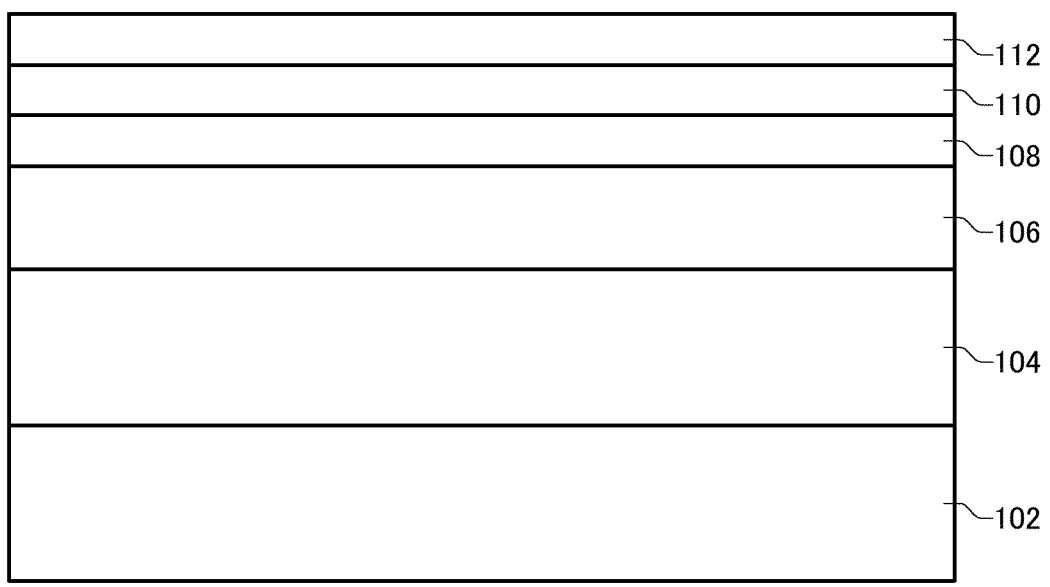
FIG. 6B shows a method for manufacturing the semiconductor device of the first embodiment shown in FIG. 1, according to the second embodiment of the present invention.

FIG. 6B shows a state in which a first sacrificial layer 112 is formed directly on the electron supply layer 110 shown in FIG. 6A. In the first sacrificial layer 112, the solid solubility of the impurities included in the electron supply layer 110, which is the semiconductor layer formed below the first sacrificial layer 112, is greater than that of the electron supply layer 110. Here, the impurities of the semiconductor layer include oxides formed as a result of the oxidation of the surface of the semiconductor surface, and also other impurities that are in the surface of the semiconductor layer.

The electron supply layer 110 may be formed of $Al_YGa_{1-Y}N$. Nitrogen with a high vapor pressure is selectively removed from the surface of the electron supply layer 110 of $Al_YGa_{1-Y}N$, resulting in a presence of Al and Ga greater than the stoichiometric amounts, which are impurities. Furthermore, gallium oxide, aluminum oxide, and the like are present as impurities in the surface of the electron supply layer 110 of $Al_YGa_{1-Y}N$. Here, $SiO_2$, for example, has a higher solid solubility for these impurities than $Al_YGa_{1-Y}N$. Accordingly, the first sacrificial layer 112 may be formed of $SiO_2$.

The first sacrificial layer 112 may contact the entire surface of the electron supply layer 110. Instead, in order to process a portion of the electron supply layer 110, the first sacrificial layer 112 may be formed to contact a portion of the electron supply layer 110. For example, the first sacrificial layer 112 of $SiO_2$ may be formed through PCVD, with $SiH_4$ and $N_2O$ as the raw material gas. The thickness of the first sacrificial layer 112 is 60 nm, for example.

The first sacrificial layer 112 and the electron supply layer 110 may be annealed. The annealing temperature may be 600° C. or more. For example, the first sacrificial layer 112 and the electron supply layer 110 may be annealed at 800° C. for 30 minutes, in a nitrogen environment. An electric furnace may be used for the annealing. The solid solubility of the impurities of the electron supply layer 110 is higher in the first sacrificial layer 112 than in the electron supply layer 110, and therefore these impurities diffuse from the electron supply layer 110 to the first sacrificial layer 112 during the annealing. For example, gallium and the gallium oxide, which are the impurities of the electron supply layer 110 formed of $Al_YGa_{1-Y}N$, in the surface of the electron supply layer 110 diffuse to the first sacrificial layer 112.

After the annealing of the first sacrificial layer 112 and the electron supply layer 110, the first sacrificial layer 112 is removed by a wet process. In this wet process, an etchant is used on the electron supply layer 110 that can selectively wet-etch the first sacrificial layer 112. Fluorine, which can selectively etch $SiO_2$, can be used as the etchant. For example, buffered fluoric acid controlled to a temperature of 23° C. may be used. As a result of the wet etching, the impurities of the electron supply layer 110 diffused in the first sacrificial layer 112 are removed, along with the first sacrificial layer 112. In this way, the electron supply layer 110 can achieve a flat and clean surface.

As a modification of the present embodiment, the process of forming the first sacrificial layer 112, the process of annealing the first sacrificial layer 112 and the electron supply layer 110, and the process of removing the first sacrificial layer 112 may be performed two or more times. In this way, the surface of the electron supply layer 110 can be cleaned further.

Figure 6C:
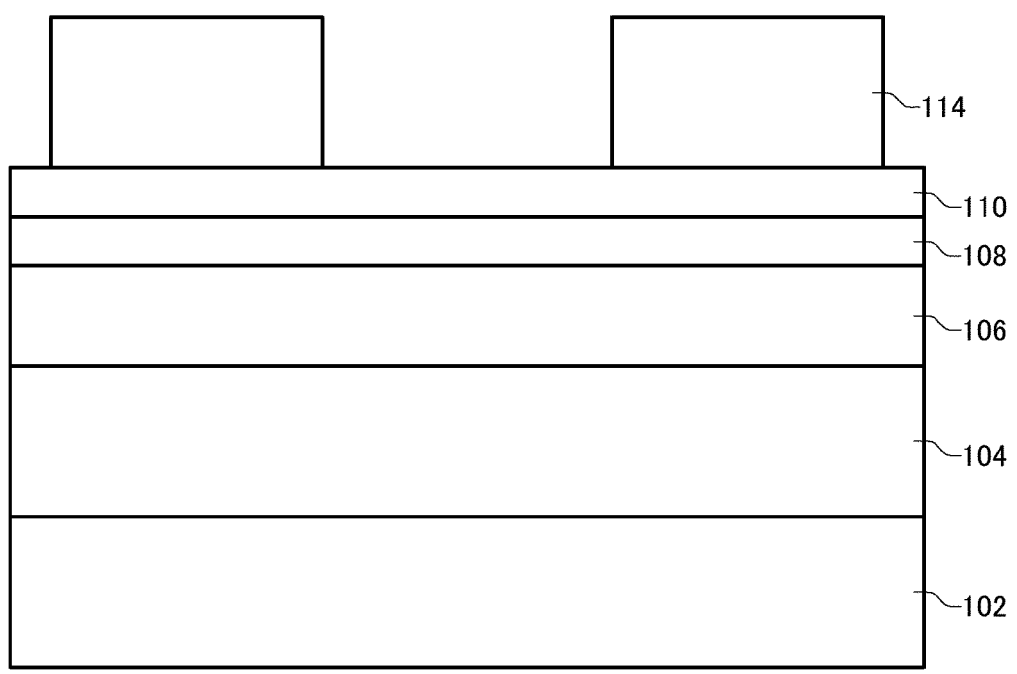
FIG. 6C shows a method for manufacturing the semiconductor device of the first embodiment shown in FIG. 1, according to the second embodiment of the present invention.
Figure 6D:
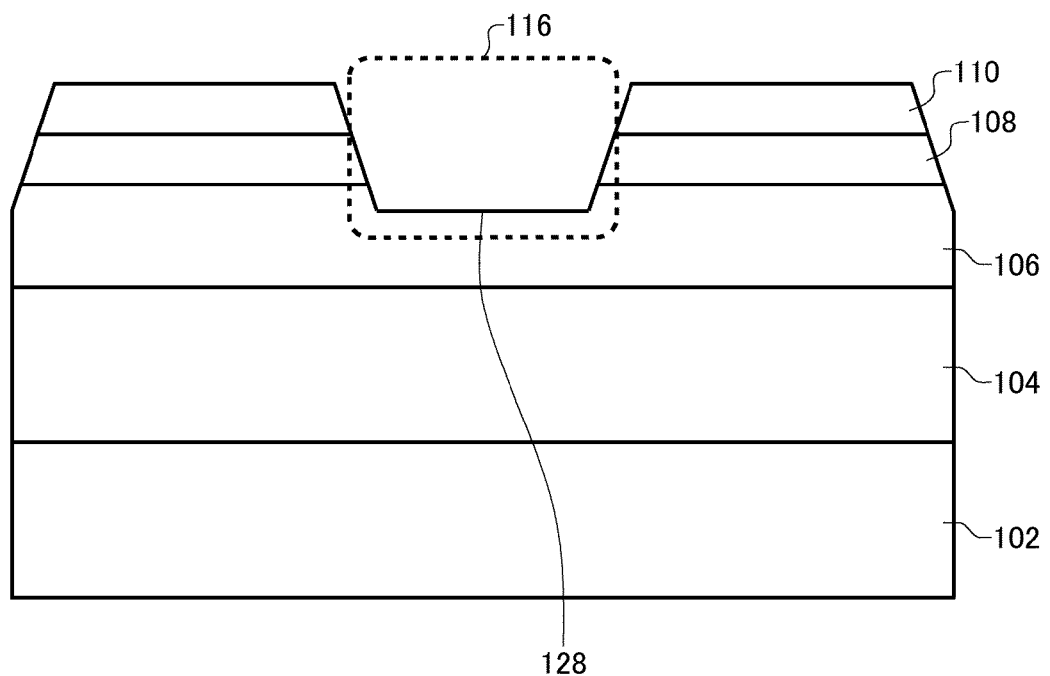
FIG. 6D shows a method for manufacturing the semiconductor device of the first embodiment shown in FIG. 1, according to the second embodiment of the present invention.

FIG. 6C shows a state in which the mask layer 114 has been formed on the electron supply layer 110 shown in FIG. 6B. The mask layer 114 may be formed of a-Si. The mask layer 114 may be formed via the same method used for the mask layer 114 shown in FIG. 2B. FIG. 6D shows a state in which the recessed portion 116 has been formed. The recessed portion 116 of the present modification may be formed via the same method used for the recessed portion 116 of FIG. 2C. A portion of the channel layer 106 may be exposed to form the recessed surface 128. Before etching portions of the electron supply layer 110 and the drift layer 108, the impurities are removed from the surface of the electron supply layer 110, and therefore the recessed surface 128 can be formed to be flat.

Figure 6E:
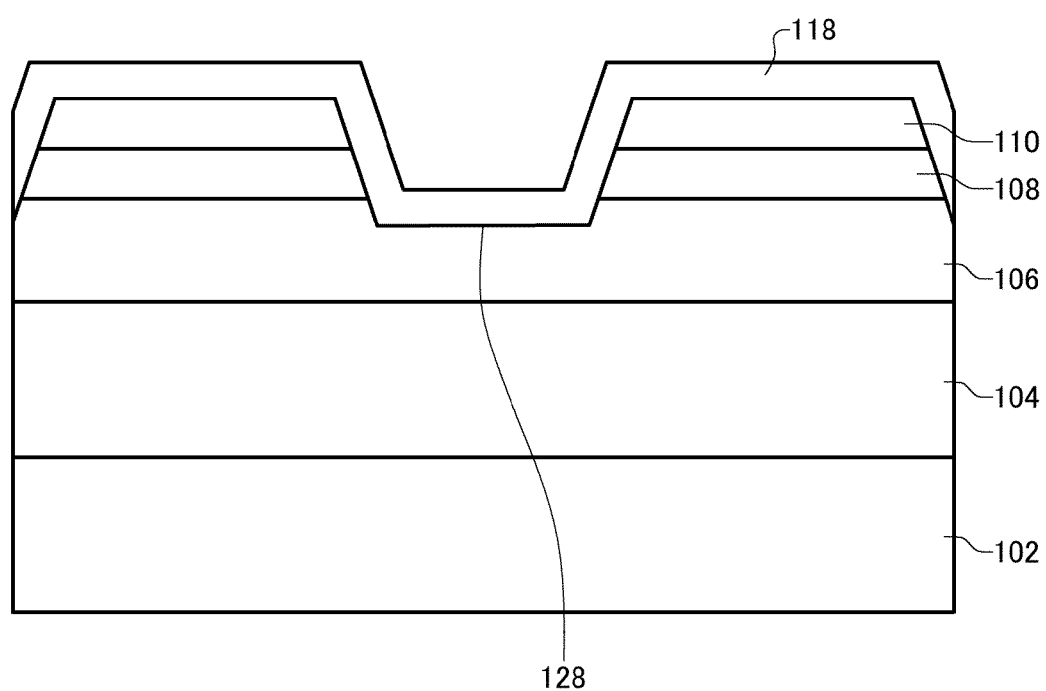
FIG. 6E shows a method for manufacturing the semiconductor device of the first embodiment shown in FIG. 1, according to the second embodiment of the present invention.

FIG. 6E shows a state in which a second sacrificial layer 118 has been formed. The second sacrificial layer 118 is formed to contact the exposed recessed surface 128 of the channel layer 106. The solid solubility of the impurities included in the channel layer 106, which is the semiconductor layer formed directly below the second sacrificial layer 118, is higher in the second sacrificial layer 118 than in the channel layer 106.

The channel layer 106 may be formed of p-type GaN. Nitrogen with a high vapor pressure is selectively removed from the surface of the channel layer 106 of p-type GaN, resulting in a presence of Ga greater than the stoichiometric amount, which is an impurity. Furthermore, gallium oxide and the like are present as impurities in the surface of the channel layer 106 of p-type GaN. Here, the impurities of the channel layer do not include the p-type GaN dopant. $SiO_2$, for example, has a higher solid solubility for these impurities than p-type GaN. Accordingly, the second sacrificial layer 118 may be formed of $SiO_2$.

The second sacrificial layer 118 may contact the recessed surface 128 exposed in the channel layer 106. The second sacrificial layer 118 may cover the patterned drift layer 108 and electron supply layer 110. For example, the second sacrificial layer 118 of $SiO_2$ may be formed through PCVD, with $SiH_4$ and $N_2O$ as the raw material gas. The thickness of the second sacrificial layer 118 is 60 nm, for example.

After this, the second sacrificial layer 118 and the channel layer 106 are annealed and the second sacrificial layer 118 is removed, in the same manner as the first sacrificial layer 112. The impurities of the recessed surface 128 of the channel layer 106 diffuse into the second sacrificial layer 118 as a result of the annealing of the second sacrificial layer 118 and the channel layer. With this annealing, the Ga, Ga oxide, and the like, which are the impurities of the channel layer 106, are diffused in the second sacrificial layer 118. When the second sacrificial layer 118 is removed through a wet process, these impurities are removed along with the second sacrificial layer 118, resulting in the recessed surface 128 of the channel layer 106 being clean and flat. After this, the gate insulating film 120 may be formed to contact and cover the recessed surface 128 of the channel layer 106, the side surface of the drift layer 108, and the side surface of the electron supply layer 110. The gate insulating film 120 may be removed from portions of the surface of the electron supply layer 110, and the source electrode 122 and drain electrode 124 may be formed in the portions from which the gate insulating film 120 was removed, thereby completing the semiconductor device 100 of FIG. 1.

As a modification of the present embodiment, the process of forming the second sacrificial layer 118, the process of annealing the second sacrificial layer 118 and the channel layer 106, and the process of removing the second sacrificial layer 118 may be performed two or more times.

Portions of the manufacturing method other than those described above are the same as those of the manufacturing method according to the first embodiment. In this way, the semiconductor device 100 is obtained.

The first sacrificial layer 112 and the second sacrificial layer 118 are preferably formed with a substrate 102 temperature no greater than 500° C. When the substrate 102 temperature exceeds 500° C., the nitrogen (N) is removed from the GaN-based semiconductor, and the resulting composition is skewed from the stoichiometric values.

The first sacrificial layer 112 and the second sacrificial layer 118 are not limited to being $SiO_2$ deposited via CVD, and instead may be deposited through CVD, sputtering, or vapor deposition, and may be formed by one or more of $SiO_X$ (0<X≤2), $AlO_X$ (0<X≤1.5), $SiN_X$ (0<X≤4/3), $GaO_X$ (0<X≤1.5), $HfO_X$ (0<X≤2), $GdO_X$ (0<X≤1.5), $MgO_X$ (0<X≤1), $ScO_X$ (0<X≤1.5), $ZrO_X$ (0<X≤2), $TaO_X$ (0≤X≤2.5), $TiO_X$ (0≤X≤2), $NiO_X$ (0≤X≤1.5), and Vanadium (V). The reason for selecting these materials is that the solid solubility of the impurities of the GaN-based semiconductor is higher for these materials than for the GaN-based impurities.

More preferably, the first sacrificial layer 112 and the second sacrificial layer 118 may be deposited through CVD and formed by one or more of $SiO_X$ (0<X≤2), $AlO_X$ (0<X≤1.5), $SiN_X$ (0<X≤4/3), $GaO_X$ (0<X≤1.5), $HfO_X$ (0<X≤2), $GdO_X$ (0<X≤1.5), $MgO_X$ (0<X≤1), $ScO_X$ (0<X≤1.5), $ZrO_X$ (0<X≤2), $TaO_X$ (0≤X≤2.5), $TiO_X$ (0≤X≤2), and $NiO_X$ (0≤X≤1.5). Furthermore, the first sacrificial layer 112 and the second sacrificial layer 118 may be formed through sputtering or vapor deposition, and formed of one or more of Ta, Ti, Ni, and V.

Figure 7:
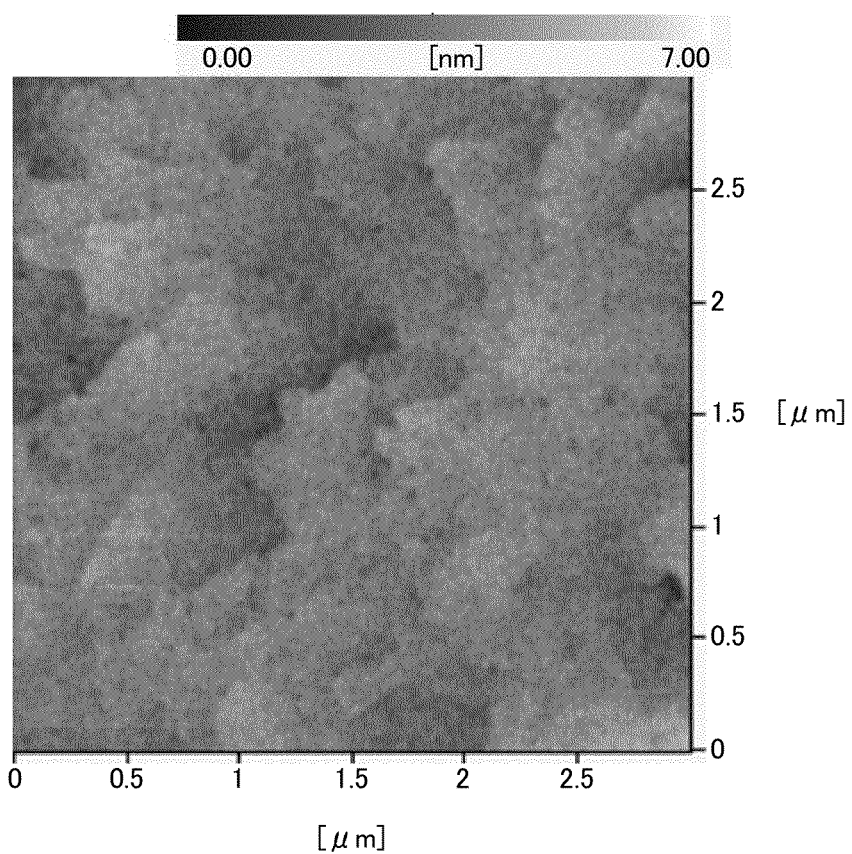
FIG. 7 is an AFM image of the semiconductor device manufactured according to the manufacturing method of the second embodiment.

FIG. 7 is an AFM image of a recessed surface 128 of the channel layer 106 manufactured according to the process shown in FIG. 6D. The microwave plasma process has excellent uniformity. Furthermore, as a result of the pre-processing using the first sacrificial layer 112, the surface of the electron supply layer 110 is clean and flat. In this way, the following characteristics are achieved: the arithmetic mean roughness value Ra of the recessed surface 128 of the channel layer 106 is no greater than 0.5 nm, the difference (P–V) between the maximum peak height and the maximum valley depth of the cross-sectional curve of the recessed surface 128 is no greater than 10 nm, and the root mean square roughness RMS of the recessed surface 128 is no greater than 1.1 nm. Accordingly, the dry etching of the portions of the electron supply layer 110 and the drift layer 108 can be performed uniformly. In the semiconductor device manufactured using the manufacturing method of the second embodiment, the arithmetic mean roughness value Ra of the recessed surface 128 was 0.4322 nm, the difference (P–V) between the maximum peak height and the maximum valley depth of the cross-sectional curve was 5.618 nm, and the root mean square roughness RMS was 0.5494 nm.

Figure 8:
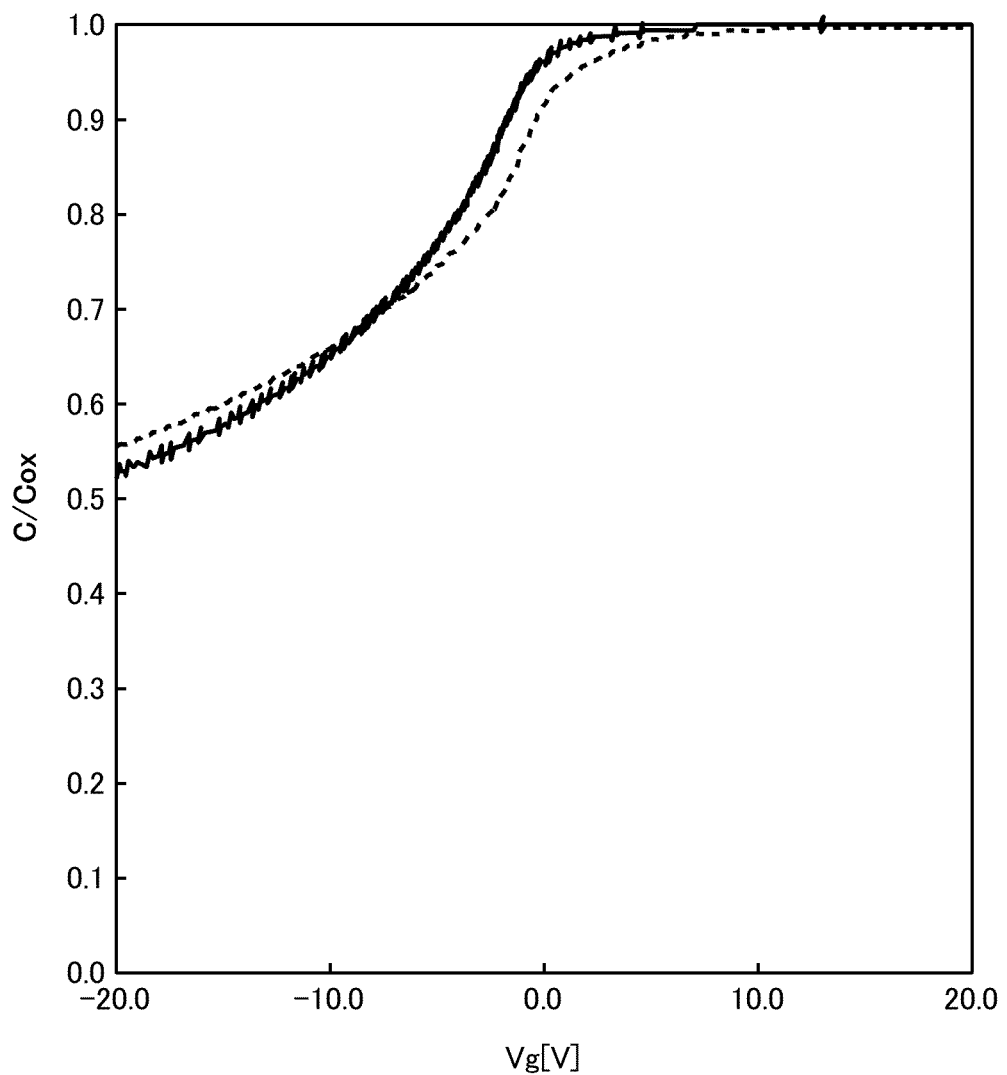
FIG. 8 shows the voltage-capacitance characteristic (C-V characteristic) of the semiconductor devices manufactured according to the manufacturing methods of the first and second embodiments.

FIG. 8 shows the voltage-capacitance characteristic (C-V characteristic) between the channel layer 106 and the gate electrode 126 of the semiconductor devices 100 manufactured according to the manufacturing methods of the first and second embodiments. The dashed line corresponds to the semiconductor device 100 manufactured according to the first embodiment, and the solid line corresponds to the semiconductor device 100 manufactured according to the second embodiment. The measurement of the C-V characteristic was performed at 1 MHz. When the gate voltage (Vg) is 0 V, in the semiconductor device 100 manufactured according to the first embodiment, C/Cox is 0.9. In the semiconductor device 100 manufactured according to the second embodiment, C/Cox exceeds 0.95. The slope of the C-V characteristic curve is greater in the semiconductor device 100 manufactured according to the second embodiment than in the semiconductor device 100 manufactured according to the first embodiment. This indicates that in the semiconductor device 100 manufactured according to the second embodiment, the interface state density at the interface between the gate insulating film 120 and the channel layer 106 is less than that of the semiconductor device 100 manufactured according to the first embodiment.

Figure 9:
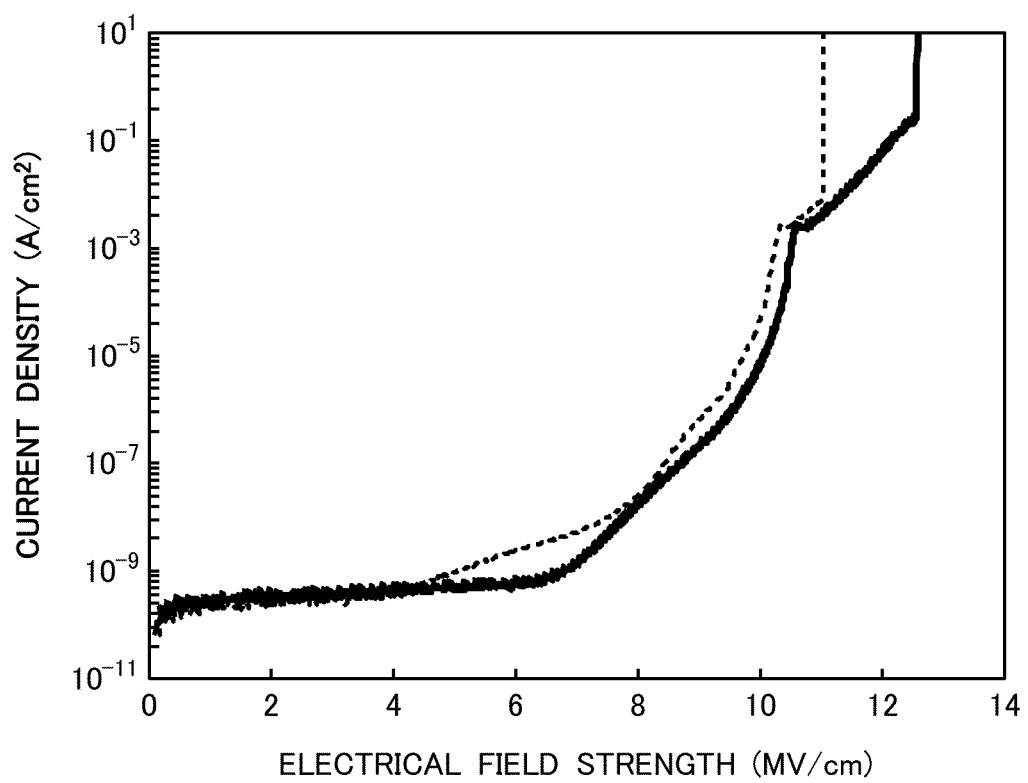
FIG. 9 shows a J-E characteristic of the semiconductor devices manufactured according to the manufacturing methods of the first and second embodiments.

FIG. 9 shows a J-E characteristic of the semiconductor devices 100 manufactured according to the manufacturing methods of the first and second embodiments. The horizontal axis represents the electrical field strength, and the vertical axis represents the current density. The dashed line corresponds to the semiconductor device 100 of the first embodiment, and the solid line corresponds to the semiconductor device 100 manufactured according to the second embodiment. In the semiconductor device 100 manufactured according to the first embodiment, the current density begins to rise from an electrical field strength value near 4.5 $MV/cm^2$, and a breakdown phenomenon occurs at an electrical field strength value of 11 $MV/cm^2$. In the semiconductor device 100 manufactured according to the second embodiment, the current density begins to rise from an electrical field strength value near 6.5 $MV/cm^2$, and a breakdown phenomenon occurs at an electrical field strength value above 12 $MV/cm^2$.

Figure 10:
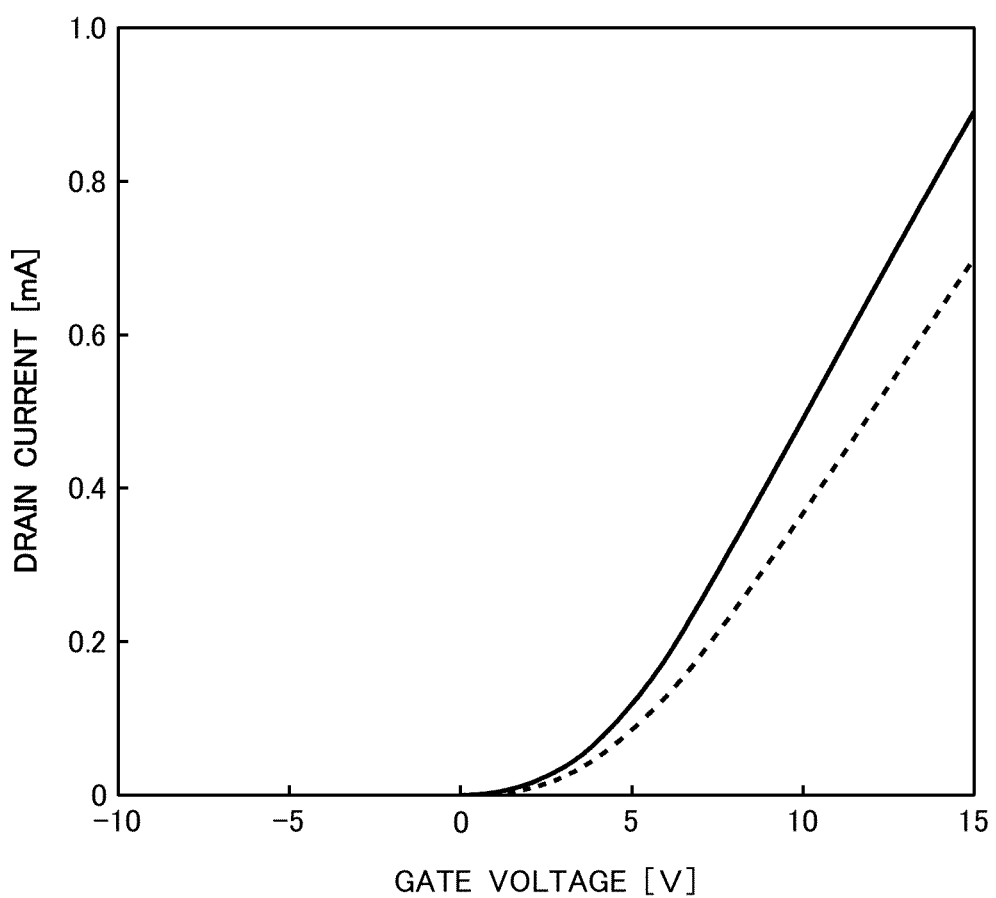
FIG. 10 shows a transmission characteristic of the semiconductor devices manufactured according to the manufacturing methods of the first and second embodiments.

FIG. 10 shows a transmission characteristic of the semiconductor devices 100 manufactured according to the manufacturing methods of the first and second embodiments. The dashed line corresponds to the semiconductor device 100 of the first embodiment, and the solid line corresponds to the semiconductor device 100 manufactured according to the second embodiment. The voltage ($V_{ds}$) between the source electrode 122 and the drain electrode 124 was set to 0.1 V, the channel length was set to 6 μm, and the channel width was set to 0.84 mm. The channel length corresponds to the length, in FIG. 1, between the end of the drift layer 108 closer to the gate electrode 126 side under the source electrode 122 and the end of the drift layer 108 closer to the gate electrode 126 side formed under the drain electrode 124. In the semiconductor device 100 manufactured according to the first embodiment, the drain current was 0.37 mA for a gate voltage of 10 V and the drain current was 0.7 mA for a gate voltage of 15 V. In the semiconductor device 100 manufactured according to the second embodiment, the drain current was 0.5 mA for a gate voltage of 10 V and the drain current was 0.9 mA for a gate voltage of 15 V.

Figure 11:
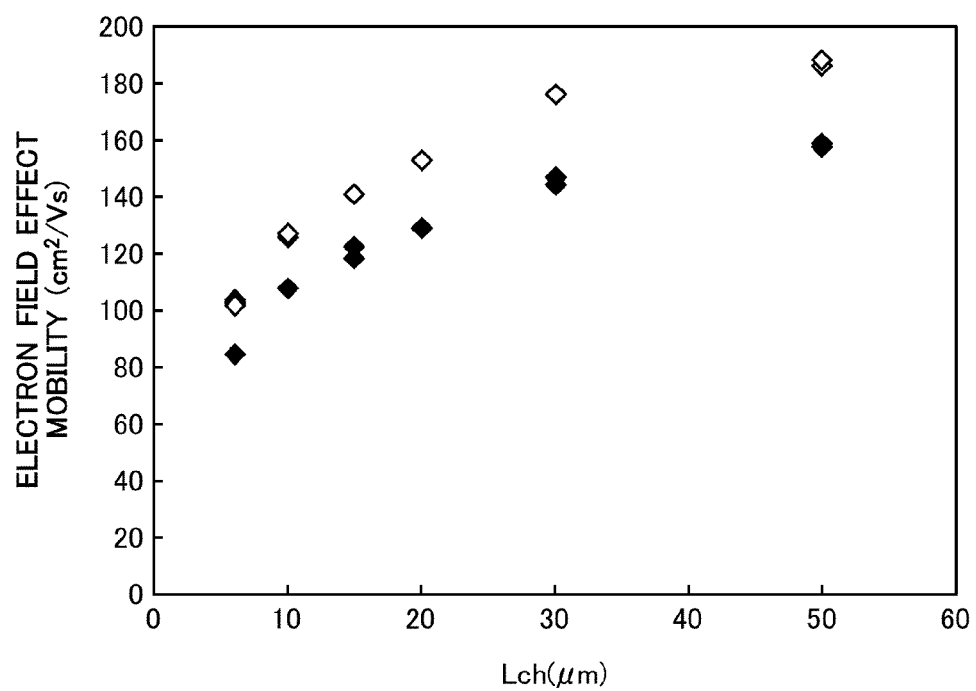
FIG. 11 shows electron field effect mobility of the carriers in the semiconductor devices manufactured according to the manufacturing methods of the first and second embodiments.

FIG. 11 shows electron field effect mobility of the carriers in the semiconductor devices 100 manufactured according to the manufacturing methods of the first and second embodiments. The black squares correspond to the semiconductor device 100 of the first embodiment, and the white squares correspond the semiconductor device 100 manufactured according to the second embodiment. The voltage ($V_{ds}$) between the source electrode 122 and the drain electrode 124 was set to 0.1 V. In the semiconductor device 100 manufactured according to the first embodiment, the electron field effect mobility of the carriers exceeded 140 $cm^2/Vs$ for a channel length of 30 μm or more and exceeded 160 $cm^2/Vs$ for a channel length of 50 μm. In the semiconductor device 100 manufactured according to the second embodiment, the electron field effect mobility of the carriers exceeded 140 $cm^2/Vs$ for a channel length of 15 μm or more, exceeded 170 $cm^2/Vs$ for a channel length of 30 μm, and was 190 $cm^2/Vs$ for a channel length of 50 μm.

Figure 12:
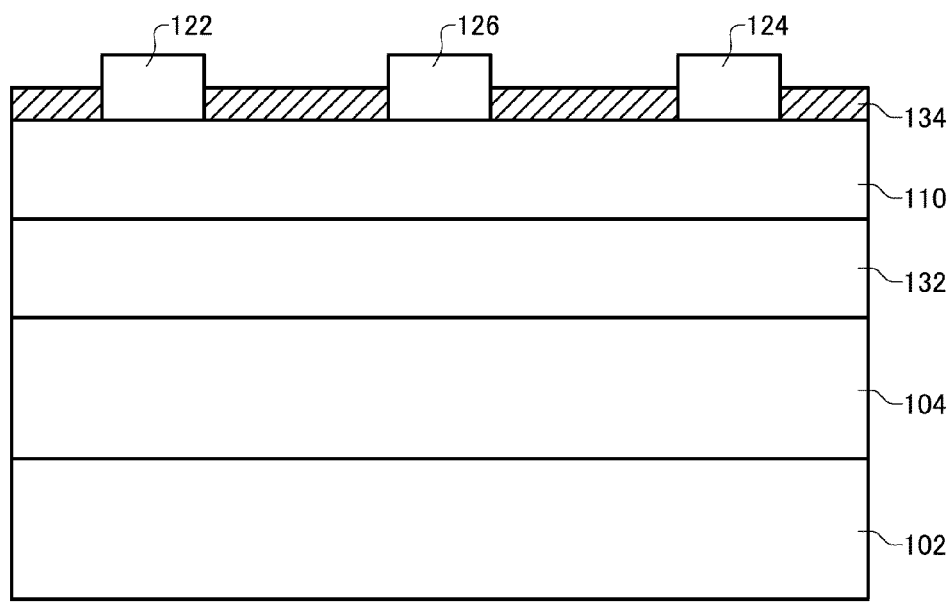
FIG. 12 is a cross-sectional view of the HFET according to a third embodiment.

FIG. 12 is a schematic cross-sectional view of an HFET 130 (GaN-based heterojunction field effect transistor) according to a third embodiment of the present invention. Components in FIG. 12 that have the same reference numerals as components in FIG. 1 may have the same function and configurations as these components as described in relation to FIG. 1. The HFET 130 includes a substrate 102, a buffer layer 104, an electron transit layer 132, an electron supply layer 110, an insulating layer 134, a source electrode 122, a drain electrode 124, and a gate electrode 126. A silicon substrate with the (111) surface as a primary surface may be used as the substrate 102. Instead, a sapphire substrate, SiC substrate, or GaN substrate may be used. The buffer layer 104 is formed on the substrate 102. The buffer layer 104 may be a semiconductor layer formed of AlGaN. The electron transit layer 132 is formed on the buffer layer 104. The electron transit layer 132 may be a semiconductor layer formed of GaN. The electron supply layer 110 is formed on the electron transit layer 132. The electron supply layer 110 may be a semiconductor layer formed of $Al_{0.25}Ga_{0.75}N$. Two-dimensional electron gas is generated near the interface between the electron supply layer 110 and the electron transit layer 132. The source electrode 122, the drain electrode 124, and the gate electrode 126 are formed on portions of the electron supply layer 110.

The HFET 130 may be formed in the following manner. In the following description, components that have the same reference numerals as components in FIGS. 6A to 6E may have the same function and configurations as these components as described in relation to FIGS. 6A to 6E. First, the buffer layer 104, the electron transit layer 132, and the electron supply layer 110 are formed on the substrate 102. After this, a first sacrificial layer, in which the solid solubility of the impurities of the electron supply layer 110 is higher than that of the electron supply layer 110, is formed contacting the electron supply layer 110. The electron supply layer 110 and the first sacrificial layer are annealed, and then the first sacrificial layer is removed through a wet process. In this way, the impurities of the electron supply layer 110 are removed, and the surface of the electron supply layer 110 becomes flat. The pre-processing using the first sacrificial layer may be performed in the same manner in the manufacturing method according to the second embodiment.

After the surface of the electron supply layer 110 is pre-processed with the first sacrificial layer, the insulating layer 134 is formed on the electron supply layer 110. The insulating layer 134 may be a $SiO_2$ film formed by CVD. The insulating layer 134 is removed from portions where the source electrode 122, the drain electrode 124, and the gate electrode 126 are to be formed. This removal may be achieved through dry etching with the microwave plasma process, using a bromine-based etching gas. The microwave plasma process may be performed in the same manner as described in the manufacturing method according to the first embodiment. With the microwave plasma process using the bromine-based etching gas, the surface of the electron supply layer 110 becomes flat and the amount of halogen remaining in the surface is reduced. The source electrode 122, the drain electrode 124, and the gate electrode 126 are formed on the portions of the electron supply layer 110 from which the insulating layer 134 has been removed. The source electrode 122, the drain electrode 124, and the gate electrode 126 may be formed of Ti/Al/Au through vapor deposition.

The above embodiments describe examples of a method for manufacturing a GaN-based heterojunction field effect transistor and a GaN-based MOS field effect transistor, but the present invention is not limited to this, and the sacrificial layer described in the manufacturing method according to the first and second embodiments can also be applied to heterojunction field effect transistors and MOS field effect transistors that use other semiconductor bodies and include group III-V compound semiconductors. For example, in a GaAs based semiconductor device, such as a GaAs and AlGaAs semiconductor device, the amount of As in the surface of the GaAs-based semiconductor layer exceeds the stoichiometric amount, and therefore acts as an impurity. Furthermore, As oxides are present in the surface of the GaAs-based semiconductor layer. Therefore, a sacrificial layer in which the solid solubility of the impurities of the GaAs-based semiconductor layer is higher than that of the GaAs-based semiconductor layer may be formed on the GaAs-based semiconductor layer. After the GaAs-based semiconductor layer and this sacrificial layer are annealed, the sacrificial layer can be removed through a wet process. Accordingly, by pre-processing with the sacrificial layer, the surface of the GaAs-based semiconductor layer can be made flat and clean. The sacrificial layers used for the GaAs-based semiconductor layer may be an amorphous silicon film or a polysilicon film in which the As solid solubility is greater than that of the GaAs-based semiconductor layer.

Furthermore, the etching using the microwave plasma and the pre-processing using the sacrificial layer can be applied to a method for manufacturing other semiconductor devices, such as a MISFET, a bipolar transistor, a Schottky diode, and the like.

Figure 13:
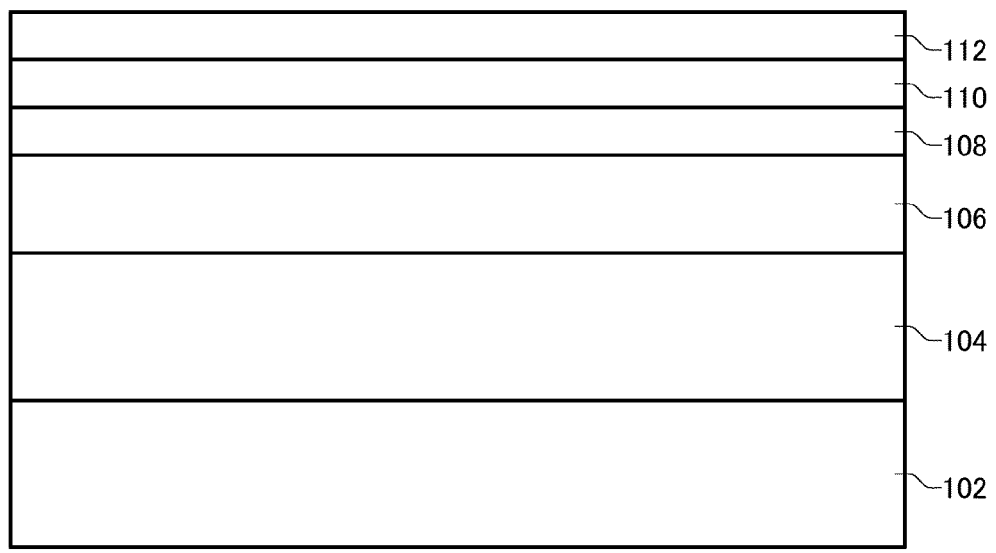
FIG. 13 is a cross-sectional view of a semiconductor substrate in which the buffer layer, the channel layer, the drift layer, the electron supply layer, and the first sacrificial layer are formed on the substrate.

FIG. 13 shows a state in which the buffer layer 104, the channel layer 106, the drift layer 108, the electron supply layer 110, and the first sacrificial layer 112 are formed on the substrate 102. In FIG. 13, components that have the same reference numerals as components in FIG. 6B may have the same function and configurations as these components as described in relation to FIG. 6B. In the present embodiment, the buffer layer 104 is a composite layer formed by alternately layering GaN layers and AlN layers. The channel layer 106 is formed of p-type GaN. The drift layer 108 is formed of u-GaN. The electron supply layer 110 is formed of $Al_YGa_{1-Y}N$ (0<Y<1). The first sacrificial layer 112 is formed of $SiO_2$ with a thickness of 60 nm. This configuration corresponds to the state shown in FIG. 6B, in which the first sacrificial layer 112 has been formed on the electron supply layer 110.

Figure 14:
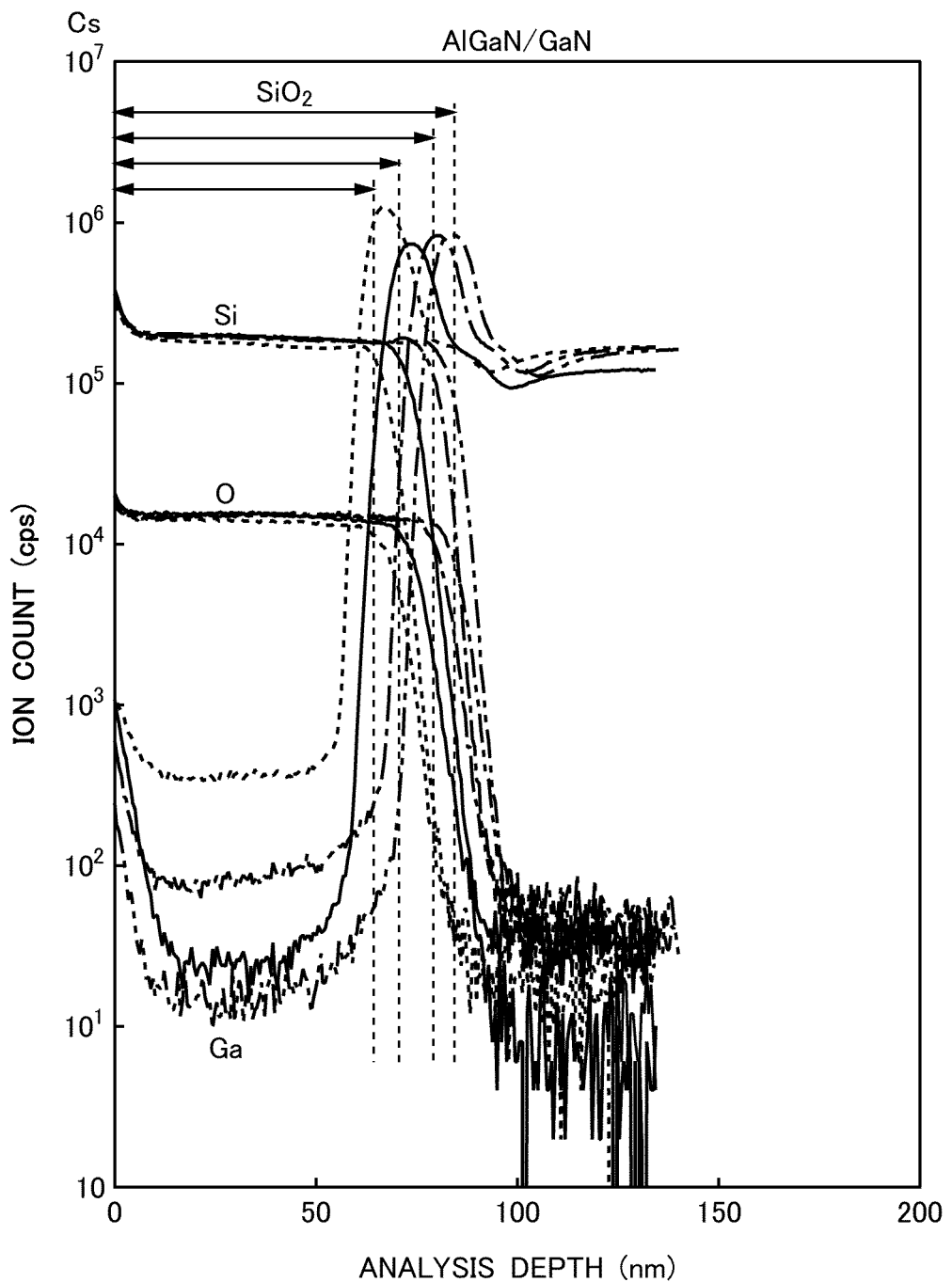
FIG. 14 shows SIMS measurement results for the semiconductor substrate shown in FIG. 13.

The graph of FIG. 14 shows measurement results of a depth distribution of silicon, oxygen, and gallium particles in the state shown in FIG. 13, obtained through an SIMS analysis. Cesium ions were used as the primary ions in the SIMS analysis. In the graph, the horizontal axis represents depth from the surface, and the vertical axis represents the ion count. In the graph, the line of alternating long and two short dashes represents the results measured prior to the formation and annealing of the first sacrificial layer 112. The line of alternating long and short dashes represents the results measured for a state in which the first sacrificial layer 112 has been formed and annealed in a nitrogen atmosphere at 800° C. for 30 minutes. The solid line represents results obtained from the SIMS analysis in a state where, after the annealing, the first sacrificial layer 112 was removed by buffered fluoric acid and the first sacrificial layer 112 was then reformed. The dashed line represents results obtained from the SIMS analysis in a state where, from the state represented by the solid line, annealing is performed in a nitrogen atmosphere at 800° C. for 30 minutes.

From the results of the SIMS analysis, it is understood that the annealing causes Ga particles to diffuse from the surface of the electron supply layer 110 formed of $Al_YGa_{1-Y}N$ to the first sacrificial layer 112 formed of $SiO_2$. Here, the surface of the electron supply layer 110 contains, as impurities, an amount of Ga exceeding the stoichiometric amount and Ga oxides. The results of the SIMS analysis indicate that gettering of these impurities occurs in the first sacrificial layer 112. This is due to the Ga solid solubility being higher for $SiO_2$ than for $Al_YGa_{1-Y}N$.

The results of the SIMS analysis shown in FIG. 14 indicate that the oxides are removed from the surface of the electron supply layer 110 by forming the first sacrificial layer 112, annealing the first sacrificial layer 112 and the electron supply layer 110, and then removing the first sacrificial layer 112. These results also indicate that the electron supply layer 110 is made flat and clean when the removal of the $Al_yGa_{1-y}N$ progresses, as a result of repeating the process using the first sacrificial layer 112.

Figure 15:
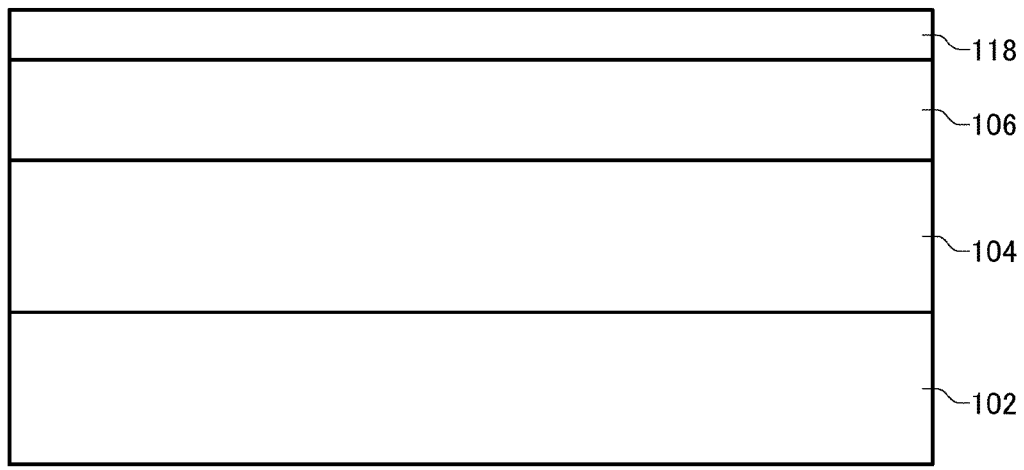
FIG. 15 is a cross-sectional view of a semiconductor substrate in which the buffer layer, the channel layer, and the second sacrificial layer are formed on the substrate.

FIG. 15 shows a state in which the buffer layer 104 including alternating GaN layers and AlN layers, the channel layer 106 formed of p-type GaN, and the second sacrificial layer 118 formed of $SiO_2$ with a thickness of 60 nm have been formed on the substrate 102. Components in FIG. 15 that have the same reference numerals as components in FIG. 6E may have the same function and configurations as these components as described in relation to FIG. 6E. This configuration corresponds to the state shown in FIG. 6E, where the second sacrificial layer 118 has been formed on the recessed surface 128 of the channel layer 106.

Figure 16:
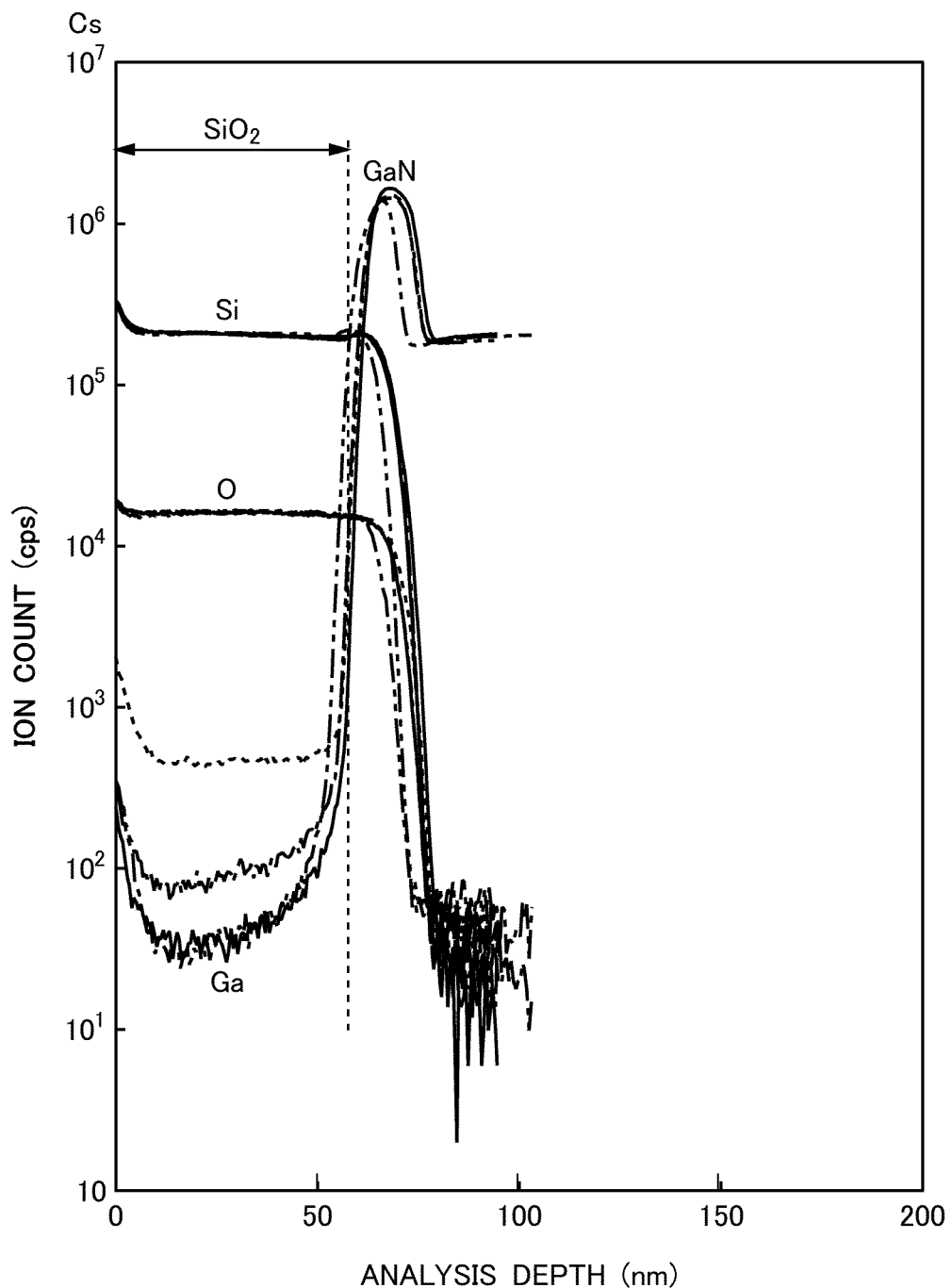
FIG. 16 shows SIMS measurement results for the semiconductor substrate shown in FIG. 15.

The graph of FIG. 16 shows measurement results of a depth distribution of silicon, oxygen, and gallium particles in the state shown in FIG. 15, obtained through an SIMS analysis. The SIMS analysis was performed in the same manner as shown in FIG. 14. In the graph, the line of alternating long and two short dashes represents the results measured prior to the formation and annealing of the second sacrificial layer 118. The line of alternating long and short dashes represents the results measured for a state in which the second sacrificial layer 118 has been formed and annealed in a nitrogen atmosphere at 800° C. for 30 minutes. The solid line represents results obtained from the SIMS analysis in a state where, after the annealing, the second sacrificial layer 118 was removed by buffered fluoric acid and the second sacrificial layer 118 was then reformed. The dashed line represents results obtained from the SIMS analysis in a state where, from the state represented by the solid line, annealing is performed in a nitrogen atmosphere at 800° C. for 30 minutes.

From the results of the SIMS analysis, it is understood that the annealing causes Ga particles to diffuse from the surface of the channel layer 106 formed of p-type GaN to the second sacrificial layer 118 formed of $SiO_2$. Here, the surface of the channel layer 106 contains, as impurities, an amount of Ga exceeding the stoichiometric amount and Ga oxides. The results of the SIMS analysis indicate that gettering of these impurities occurs in the second sacrificial layer 118. This is due to the Ga solid solubility being higher for $SiO_2$ than for GaN. Furthermore, the SIMS analysis results shown in FIG. 16 indicate that the oxides are removed from the surface of the channel layer 106 by forming the second sacrificial layer 118, annealing the second sacrificial layer 118 and the channel layer 106, and then removing the second sacrificial layer 118.

While the embodiments of the present invention has have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

100: semiconductor device, 102: substrate, 104: buffer layer, 106: channel layer, 108: drift layer, 110: electron supply layer, 112: sacrificial layer, 114: mask layer, 116: recessed portion, 118: sacrificial layer, 120: gate insulating film, 122: source electrode, 124: drain electrode, 126: gate electrode, 128: recessed surface, 130: HFET, 132: electron transit layer, 134: insulating layer, 250: microwave plasma apparatus, 252: processed substrate, 254: stage, 256: dielectric, 258: processing chamber, 260: showerhead, 262: antenna

What is claimed is:

1. A method of manufacturing a gallium-nitride-based semiconductor device, comprising:
    forming a first semiconductor layer of a gallium-nitride-based semiconductor;
    forming a recessed portion by dry etching a portion of the first semiconductor layer by a microwave plasma process using a bromine-based gas;
    forming a first sacrificial layer that contacts the first semiconductor layer and has a higher solid solubility for impurities included in the first semiconductor layer than the first semiconductor layer;
    annealing the first sacrificial layer and the first semiconductor layer; and
    removing the first sacrificial layer through a wet process, wherein
    forming the recessed portion includes etching, via the microwave plasma process, a region from which the first sacrificial layer has been removed.

2. The method of manufacturing a gallium-nitride-based semiconductor device according to claim 1, wherein
    the microwave plasma process is performed by a microwave plasma apparatus that includes a processing chamber in which a process using plasma is performed, a dielectric that introduces microwaves, and a showerhead that introduces an etching gas between the dielectric and the first semiconductor layer.

3. The method of manufacturing a gallium-nitride-based semiconductor device according to claim 1, wherein
    the first sacrificial layer is formed at a temperature no greater than 500° C.

4. The method of manufacturing a gallium-nitride-based semiconductor device according to claim 1, wherein
    the first sacrificial layer is formed by one or more of $SiO_X$ (0<X≤2), $AlO_X$ (0<X≤1.5), $SiN_X$ (0<X≤4/3), $GaO_X$ (0<X≤1.5), $HfO_X$ (0<X≤2), $GdO_X$ (0<X≤1.5), $MgO_X$ (0<X≤1), $ScO_X$ (0<X≤1.5), $ZrO_X$ (0<X≤2), $TaO_X$ (0≤X≤2.5), $TiO_X$ (0≤X≤2), $NiO_X$ (0≤X≤1.5), and V.

5. A method of manufacturing a gallium-nitride-based semiconductor device, comprising:
    forming a first semiconductor layer of a gallium-nitride-based semiconductor;
    forming a recessed portion by dry etching a portion of the first semiconductor layer by a microwave plasma process using a bromine-based gas; and
    forming a second semiconductor layer below the first semiconductor layer, wherein
    the recessed portion passes through the first semiconductor layer in a depth direction and partially exposes the second semiconductor layer, the method further comprising:

forming a second sacrificial layer that contacts the exposed surface of the second semiconductor layer in the recessed portion and that has a higher solid solubility for impurities included in the second semiconductor layer than the second semiconductor layer;

annealing the second sacrificial layer and the second semiconductor layer; and removing the second sacrificial layer through a wet process.

6. The method of manufacturing a gallium-nitride-based semiconductor device according to claim 5, wherein
the second semiconductor layer is formed of a gallium-nitride-based semiconductor.

7. The method of manufacturing a gallium-nitride-based semiconductor device according to claim 6, further comprising forming a source electrode and a drain electrode that are electrically connected to the first semiconductor layer.

8. The method of manufacturing a gallium-nitride-based semiconductor device according to claim 6, wherein the second sacrificial layer is formed at a temperature no greater than 500° C.

9. The method of manufacturing a gallium-nitride-based semiconductor device according to claim 6, wherein
the second sacrificial layer is formed by one or more of $SiO_X$ ($0<X\le2$), $AlO_X$ ($0<X\le1.5$), $SiN_X$ ($0<X\le4/3$), $GaO_X$ ($0<X\le1.5$), $HfO_X$ ($0<X\le2$), $GdO_X$ ($0<X\le1.5$), $MgO_X$($0<X\le1$), $ScO_X$($0<X\le1.5$), $ZrO_X$($0<X\le2$), $TaO_X$ ($0\le X\le2.5$), $TiO_X$ ($0\le X\le2$), $NiO_X$ ($0\le X\le1.5$), and V.

10. The method of manufacturing a gallium-nitride-based semiconductor device according to claim 5, wherein
the second sacrificial layer is formed by CVD, sputtering, or vapor deposition.

11. The method of manufacturing a gallium-nitride-based semiconductor device according to claim 5, wherein
the microwave plasma process is performed by a microwave plasma apparatus that includes a processing chamber in which a process using plasma is performed, a dielectric that introduces microwaves, and a showerhead that introduces an etching gas between the dielectric and the first semiconductor layer.

* * * * *